(12) United States Patent
Elliott et al.

(10) Patent No.: US 7,629,664 B1
(45) Date of Patent: Dec. 8, 2009

(54) LATERAL-MOVING MICROMACHINED THERMAL BIMORPH AND METHOD FOR FABRICATING SAME

(75) Inventors: Robert Faye Elliott, Madison, AL (US); Philip John Reiner, Huntsville, AL (US)

(73) Assignee: Morgan Research Corporation, Huntsville, AL (US)

( * ) Notice: Subject to any disclaimer, the term of this patent is extended or adjusted under 35 U.S.C. 154(b) by 544 days.

(21) Appl. No.: 11/149,882

(22) Filed: Jun. 10, 2005

Related U.S. Application Data

(60) Provisional application No. 60/619,407, filed on Oct. 15, 2004.

(51) Int. Cl.
*H01L 31/058* (2006.01)
(52) U.S. Cl. .............................. 257/467; 257/E29.347
(58) Field of Classification Search ................. 257/467, 257/E29.347
See application file for complete search history.

(56) References Cited

U.S. PATENT DOCUMENTS

| | | | |
|---|---|---|---|
| 4,400,634 A | 8/1983 | Micheron | |
| 4,916,349 A | 4/1990 | Kornrumpf | |
| 5,382,864 A | 1/1995 | Morikawa et al. | |
| 5,463,233 A | 10/1995 | Norling | |
| 5,515,725 A | 5/1996 | Tabota et al. | |
| 5,917,226 A | 6/1999 | Chan et al. | |
| 6,044,646 A | 4/2000 | Silverbrook | |
| 6,211,598 B1 * | 4/2001 | Dhuler et al. | 310/307 |
| 6,246,155 B1 | 6/2001 | Nishihara et al. | |
| 6,262,516 B1 | 7/2001 | Fukuda et al. | |
| 6,393,685 B1 * | 5/2002 | Collins | 29/416 |
| 6,396,382 B1 | 5/2002 | Ross | |
| 6,483,056 B2 | 11/2002 | Hyman et al. | |
| 6,504,118 B2 | 1/2003 | Hyman et al. | |
| 6,698,201 B1 | 3/2004 | Sarkar et al. | |
| 6,756,795 B2 | 6/2004 | Hunt et al. | |
| 6,812,820 B1 | 11/2004 | Fouillet | |
| 6,853,765 B1 | 2/2005 | Cochran | |
| 2002/0074901 A1 | 6/2002 | Johansson | |
| 2002/0149296 A1 | 10/2002 | Fujii et al. | |
| 2003/0119221 A1 * | 6/2003 | Cunningham et al. | 438/52 |
| 2004/0084997 A1 | 5/2004 | Arbogast et al. | |
| 2004/0164649 A1 | 8/2004 | Xu et al. | |
| 2004/0182182 A1 | 9/2004 | Nishihara et al. | |

\* cited by examiner

*Primary Examiner*—Allan R. Wilson
(74) *Attorney, Agent, or Firm*—Greenberg Traurig, LLP

(57) ABSTRACT

The Lateral-Moving Micromachined Thermal Bimorph provides the capability of achieving in-plane thermally-induced motion on a microchip, as opposed to the much more common out-of-plane, or vertical, motion seen in many devices. The present invention employs a novel fabrication process to allow the fabrication of a lateral bimorph in a fundamentally planar set of processes. In addition, the invention incorporates special design features that allow the bimorph to maintain material interfaces.

14 Claims, 12 Drawing Sheets

LATERAL-MOVING MICROMACHINED THERMAL BIMORPH AND METHOD FOR FABRICATING SAME

REFERENCE TO RELATED APPLICATIONS

This application claims priority to Provisional Patent Application U.S. Ser. No. 60/619,407, entitled "Resettable Latching MEMS Temperature Sensor" and filed on Oct. 15, 2004, which is fully incorporated herein by reference.

GOVERNMENT LICENSE RIGHTS

This invention was made with Government support under contract MDA972-03-C-0010, awarded by the Defense Advanced Research Projects Agency ("DARPA"). The Government has certain rights in the invention.

BACKGROUND

1. Field of the Invention

The present invention relates generally to a thermal bimorph. More particularly, the present invention relates to a micromachined thermal bimorph that displaces laterally.

2. Background of the Invention

Current battery-powered embedded sensor systems often require a low power method of determining when a certain level of temperature has been reached. Typical applications, such as in transportation and shipping monitoring, heating and air conditioning, and food storage, would benefit from the ability to monitor the temperature environment with a completely unpowered sensor. In addition, these applications would benefit from the ability to poll that sensor to determine if a temperature extreme was reached, and then reset the sensor for later use. In either case, an ultra-low power sensor, or even a sensor that consumes no quiescent power, would reduce the overall system power consumption enough to allow embedded sensors to operate for decades in portable battery powered applications, or in systems that scavenge small amounts of power from the environment.

A micromachined thermal bimorph can perform the function of moving a set of miniature contacts into intimate contact when a certain level of temperature is achieved. The resulting device can be used as a temperature trigger sensor that does not require quiescent power to operate. The thermal bimorph could be based on a standard vertical thermal bimorph that moves out-of-plane under temperature loading. However, the temperature trigger sensor for such a device may require complex processing to make contacts and other structures out-of-plane of the microchip. Achieving useful, functional, and complex contact, latching, actuating, and other structures is much simpler on a microchip if performed in the plane of the chip. In order to use those functional structures, a thermal bimorph that moves laterally in the plane of the microchip is required. The present invention is that lateral-moving thermal bimorph. The present invention may be used as a temperature sensitive switch, or in other actuator applications in which lateral movement in response to temperature variation is desired.

Prior inventions have disclosed micro-machined bimorph devices, but none have had the advantages of the present invention in providing lateral movement of a thermal bimorph in response to ambient temperature changes.

For example, US 2004/0084997 A1 discloses a piezoelectric bimorph actuator comprised of two electrorestrictive materials that change length in response to an applied electrical field. This invention claims to provide lateral motion, but the motion is in fact perpendicular to the plane of the materials comprising the bimorph (i.e. vertical rather than in the plane of the surfaces). Also, the components of the bimorph are separately fabricated and then assembled and bonded together, rather than being micromachined in a one-piece structure as is the present invention. This prior art bimorph also requires electrical power to operate.

U.S. Pat. No. 5,382,864 and applications U.S. 2002/0074901 and 2002/0149296 also disclose piezoelectric bimorph actuators that displace vertically in response to an applied electrical field.

Another vertically-moving bimorph is disclosed in US 2004/0164649 A1, which describes a piezoelectric micromachined bimorph in which the two bimorph materials are fabricated separately on separate substrates and then are bonded together.

U.S. Pat. No. 5,463,233 discloses a micromachined thermal switch that uses a thermal bimorph as an electrical switch, but the movement of the thermal bimorph in this invention is also in a vertical direction rather than in the plane of the substrate. Similarly, U.S. Pat. No. 5,917,226 discloses micromachined thermal sensor comprising a thermal bimorph that displaces in a vertical direction.

Finally, U.S. Pat. No. 6,044,646 discloses a micromachined thermal actuator that can move in a direction either in the plane of or normal to the substrate. This actuator, however, does not use a simple bimorph device but employs independently-controllable heaters that require the application of external power to operate In sum, none of the prior art patents discloses a micromachined thermal bimorph that displaces in a lateral direction in response to ambient temperature changes.

SUMMARY OF THE INVENTION

It is therefore an object of the present invention to provide a laterally-moving micromachined thermal bimorph constructed utilizing semiconductor fabrication techniques.

It is a further object of the invention to provide a no-power or low-power thermal bimorph that displaces laterally in response to ambient temperature changes.

It is a further object of the invention to provide a laterally-moving thermal bimorph fabricated as a one-piece micromachined structure, without requiring separately-constructed elements that are then bonded together.

The present invention employs a micromachined thermal bimorph structure. A thermal bimorph is a thin film consisting of two layers of different materials that expand at different rates when exposed to heat, so that one layer expands more than the other upon a temperature increase, and the bimorph bends. In one embodiment of the invention, the thermal bimorph deflects and latches under a temperature load of sufficient magnitude, closing an electrical contact. External circuitry can then be used to poll the temperature sensor. A thermal, capacitive, or other actuator can be used to reset the temperature sensor by disengaging the latch and returning the bimorph to its original position. The sensor will use nearly zero power except when actually providing the trigger signal to the microcontroller or during any reset operation. The sensor can remain latched for interrogation at a later date, even if system power is lost, and the sensor can be reset to detect the next event.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

These and other embodiments of the present invention will also become readily apparent to those skilled in the art from the following detailed description of the embodiments having reference to the attached figures, the invention not being limited to any particular embodiment(s) disclosed.

Figure 1:
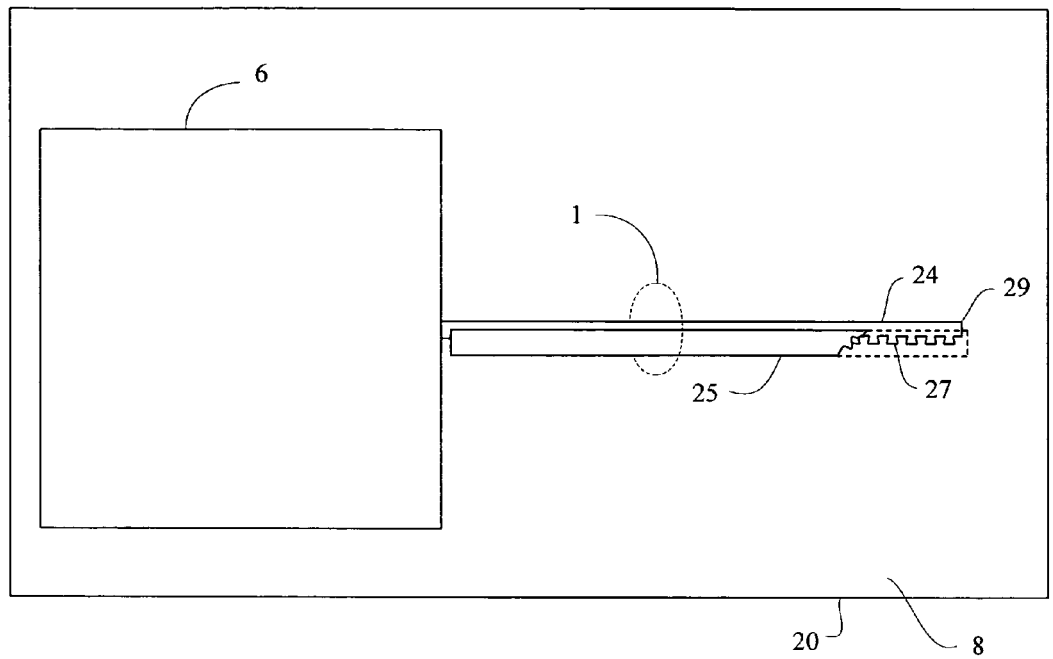
FIG. 1 is top view of one embodiment of the invention.

Repeat use of reference characters throughout the present specification and appended drawings is intended to represent the same or analogous features or elements of the invention

DETAILED DESCRIPTION

Figure 2:
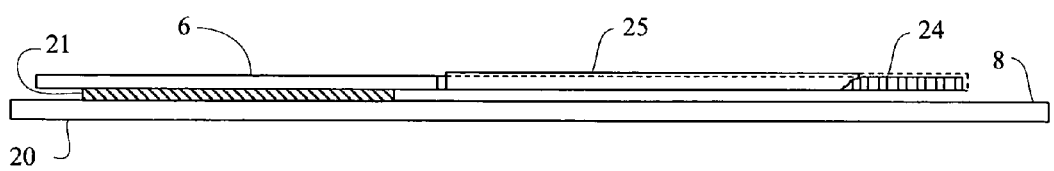
FIG. 2 is a side view of one embodiment of the invention.
Figure 3:
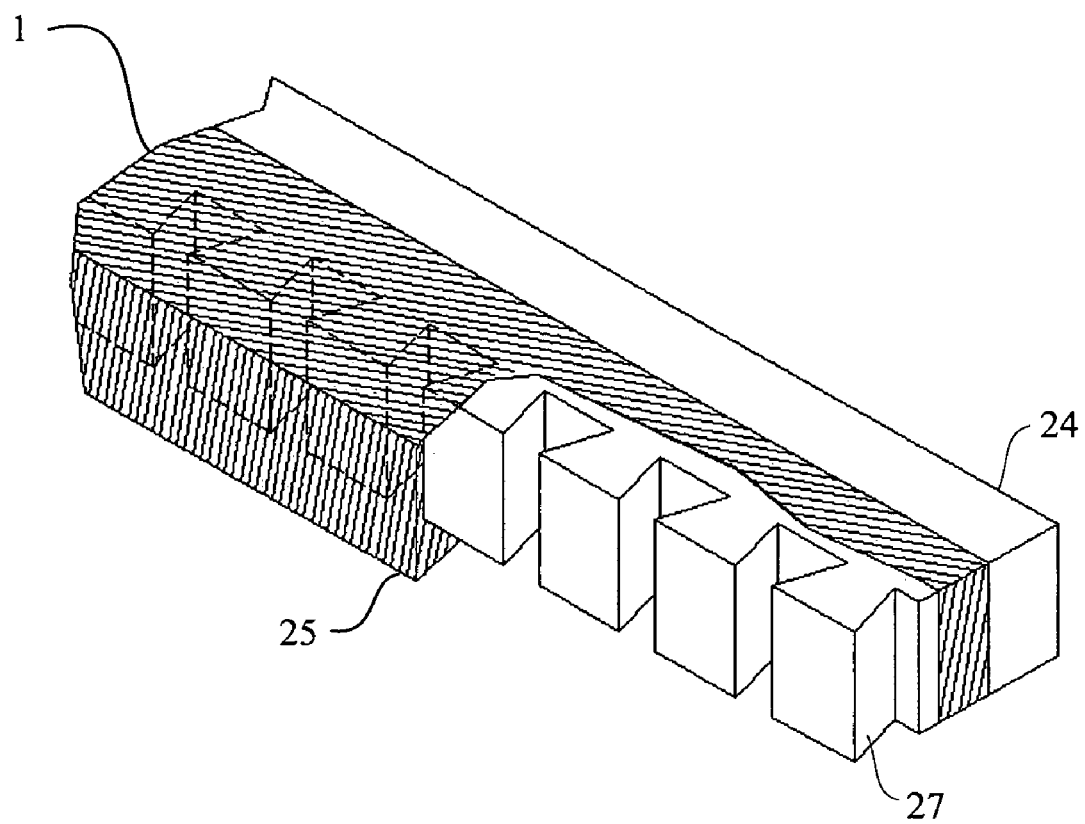
FIG. 3 is a perspective view of the end of one embodiment of the thermal bimorph.

One embodiment of the invention is fabricated in a thick device layer of silicon or other conductor material on a silicon-on-insulator ("SOI") wafer consisting of the device layer, a buried oxide layer, and a handle wafer. FIG. 1 and FIG. 2 illustrate a top and side view of this embodiment of the invention. In this embodiment, the thermal bimorph 1 consists of a micromachined cantilever beam 24 fabricated from the device layer and a sidewall coating 25 of a second, different material with a coefficient of thermal expansion mismatch to the conductor material. Upon application of a temperature load, the thermal bimorph 1 will bend so that its free end 29 moves in a lateral direction (i.e., in a direction substantially perpendicular to the length of the thermal bimorph 1 and substantially parallel to the etched surface 8 of the handle wafer 20). The thermal bimorph 1 is anchored to the handle wafer 20 via anchor 6. The sidewall coating 25 is shown in FIG. 1 and FIG. 2 as partially removed to illustrate dovetail features 27 of the beam 24 beneath. FIG. 3 is a closer perspective view of the end of the thermal bimorph 1 with the sidewall coating 25 partially removed to show the dovetail features 27 of the beam 24.

Figure 4A:
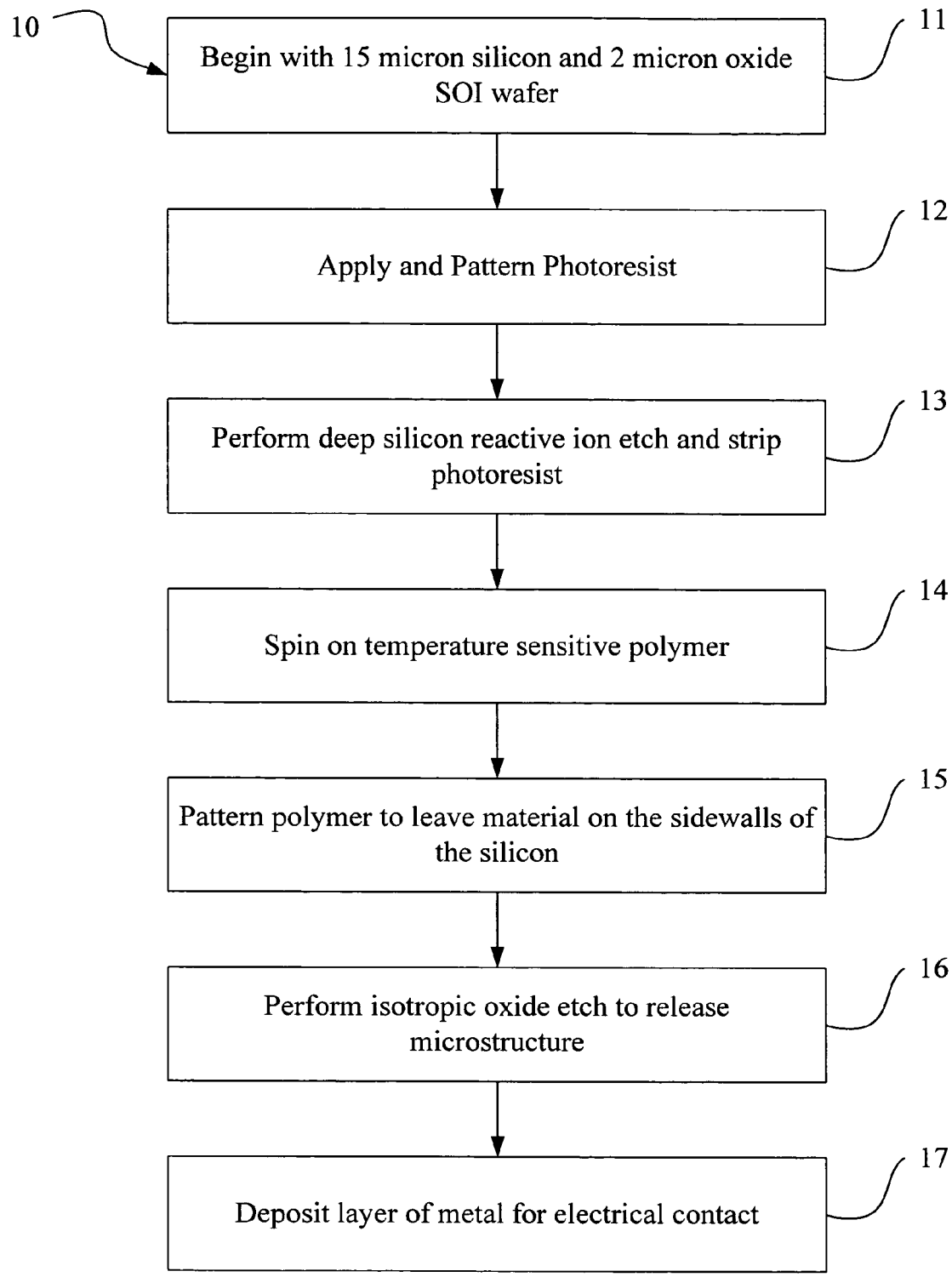
FIG. 4A is a high-level flowchart of an embodiment of a process according to the present invention.

FIG. 4A illustrates the high-level process flow 10 for the process used to fabricate one embodiment of the bimorph. While the following discussion focuses on producing a silicon/polyimide thermal bimorph with the process discussed herein, other combinations of materials and other processes can be employed. FIGS. 4B through 4H illustrate the steps in the fabrication process, viewed from the "free" end of the thermal bimorph.

Figure 4B:
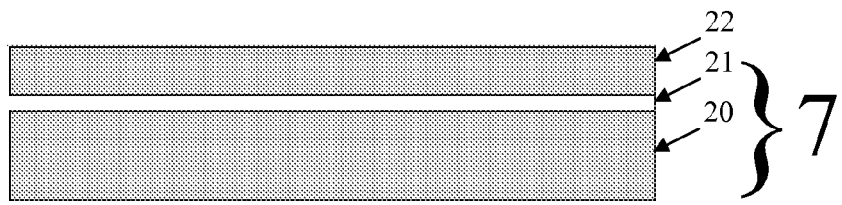
FIGS. 4B-4H illustrate steps in the process of fabricating one embodiment of the present invention.
Figure 4C:
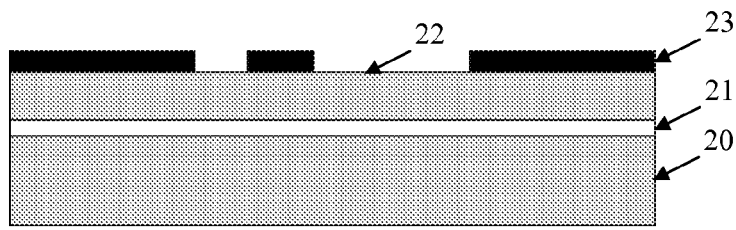

Employing the process illustrated by FIGS. 4A and 4B, the starting material is an SOI wafer 7 with a handle wafer 20 and a 15-micron thick active silicon device layer 22 separated by a 2 micron thick silicon dioxide layer 21. With attention to FIG. 4C, which illustrates step 12 (FIG. 4A) in greater detail, the SOI wafer is first patterned with photoresist 23 using standard lithography to define a silicon cantilever beam with dovetail features.

Figure 5:
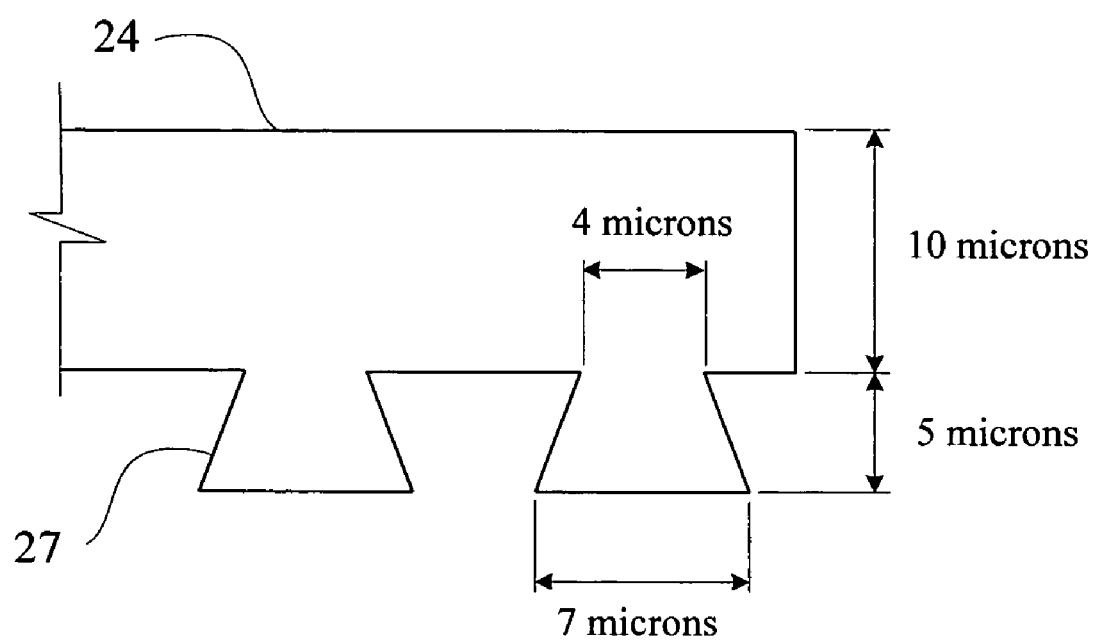
FIG. 5 is a partial top view of the invention illustrating the dovetail dimensions for one embodiment of the thermal bimorph.

FIG. 5 illustrates the beam 24 with its dovetail features 27. The dovetail features 27 of the beam 24 are designed to improve the adhesion of the subsequent second bimorph material to this first material. The dimensions shown in FIG. 5 illustrate one set of possible dimensions for defining the dovetail, although other dimensions and other surface treatments known to one with skill in the art have been and could be employed to improve the adhesion of the second bimorph material to the first material.

Figure 4D:
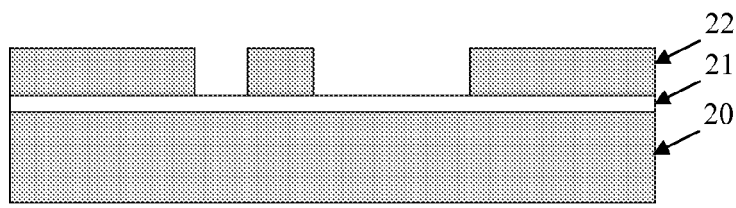
Figure 4E:
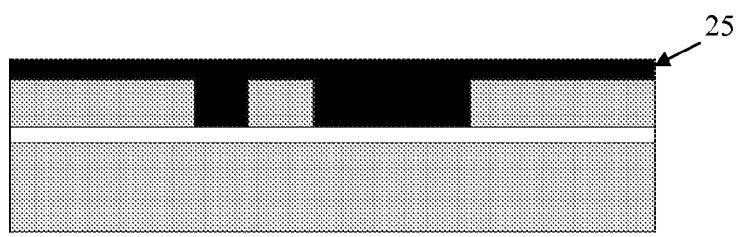
Figure 4F:
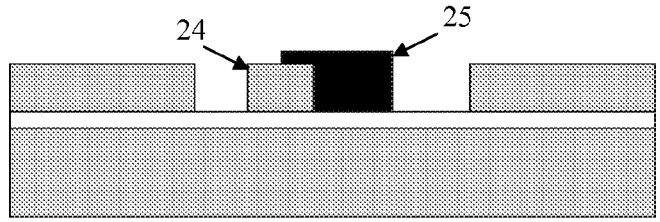

As illustrated in FIG. 4D, which shows step 13 of the fabrication process, a deep silicon reactive ion etch exposes the structure of the beam 24. FIG. 4E (step 14) illustrates a temperature sensitive polymer 25 that is applied by spin coating after the deep silicon etch. This layer of polymer 25 is then patterned as shown in FIG. 4F (step 15) to allow portions of the polymer 25 to remain in place along the sidewalls of the beam 24. This polymer 25 forms the temperature sensitive material for the thermal bimorph.

Figure 6:
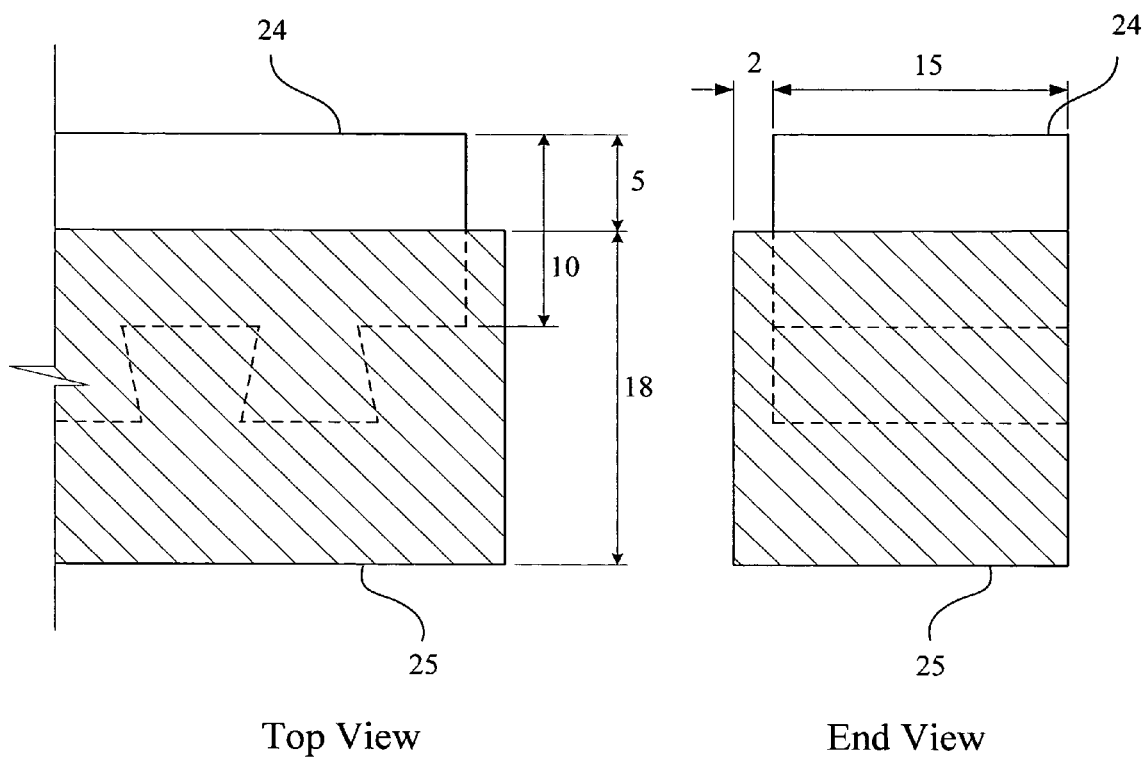
FIG. 6 is a partial top view of the invention illustrating the dimensions of one embodiment of the silicon/polymide layers of the bimorph.

In one embodiment of the invention, the polymer 25 is deposited with dimensions approximating those illustrated in FIG. 6 (dimensions in microns). The 2 micron overlapping of the polymer 25 onto the silicon 24 at the end of the silicon beam 24 is necessary to allow polymer shrinkage during cure and developing.

Figure 4G:
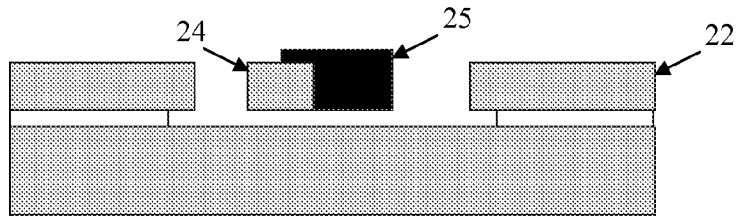
Figure 4H:
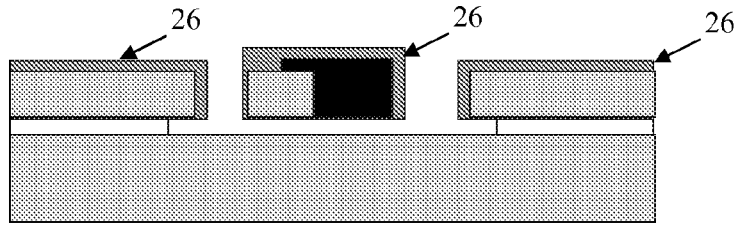

As is illustrated in FIG. 4G (step 16), after the polymer pattern is transferred and the polymer is developed, the silicon dioxide layer 21 in between the device layer 22 and the handle wafer 20 is removed with an isotropic oxide etch that allows portions of the silicon dioxide layer 21, specifically those underneath anchors and bond pads (not illustrated), to remain and hold the thermal bimorph to the substrate. (Refer to FIG. 1 for a side view of an anchor 6 showing the partially-removed silicon dioxide layer 21.) After the silicon 24/polymer 25 structure is released from the handle wafer, the entire device is coated at an angle with a metal deposition system using a process that places metal 26 on the sidewalls of the structure, as illustrated in FIG. 4H (step 17). This metal is critical as it forms the contacts that the sensor uses.

Figure 7:
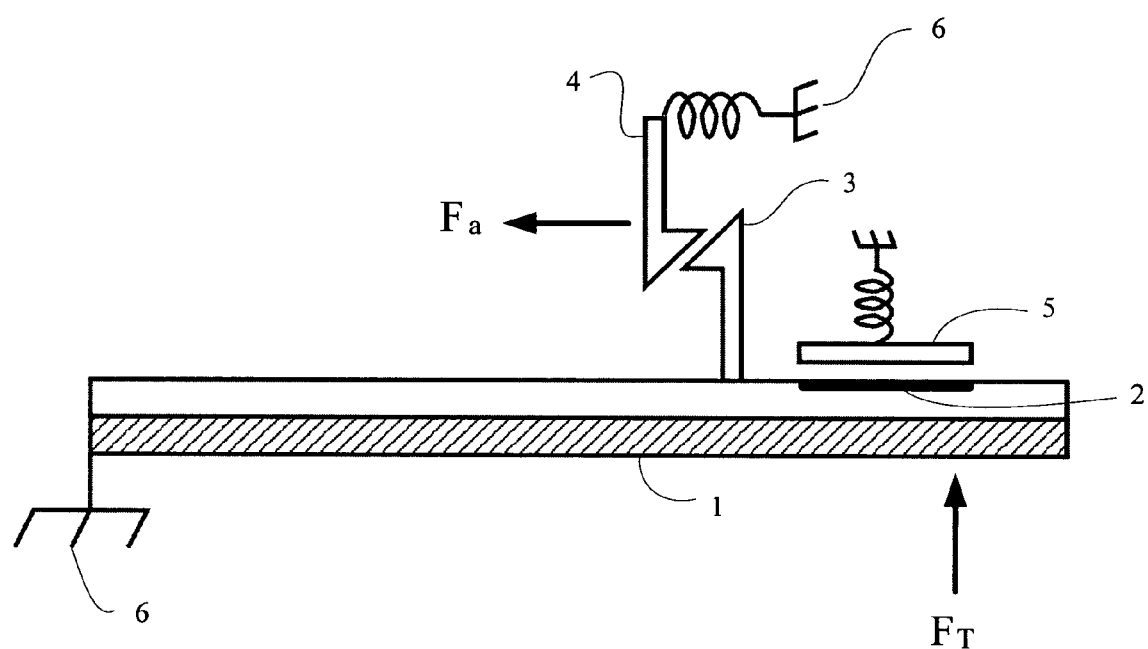
FIG. 7 is a schematic diagram of one embodiment of the bimorph used as a temperature sensor.

FIG. 7 illustrates a schematic diagram of one embodiment of the invention used as a temperature sensor. In this embodiment, the thermal bimorph 1 includes a contact area 2 and a latch 3. Under a temperature load, T, the bending moment of the bimorph yields a force, $F_T$, that displaces the bimorph sufficiently to force the latch 3 to engage with a similar latch on a thin flexure or pawl 4 attached to the substrate (not illustrated) via anchors 6. The force also causes the bimorph contact area 2 to connect with a spring-loaded contact 5. After latching, the contacts remain closed, and the temperature sensor can then be interrogated by external circuitry (not illustrated). A thermal, capacitive, or other actuator (discussed below) can be used to develop a force, $F_a$, and disengage the pawl 4 and return the bimorph 1 to its original position.

Figure 8:
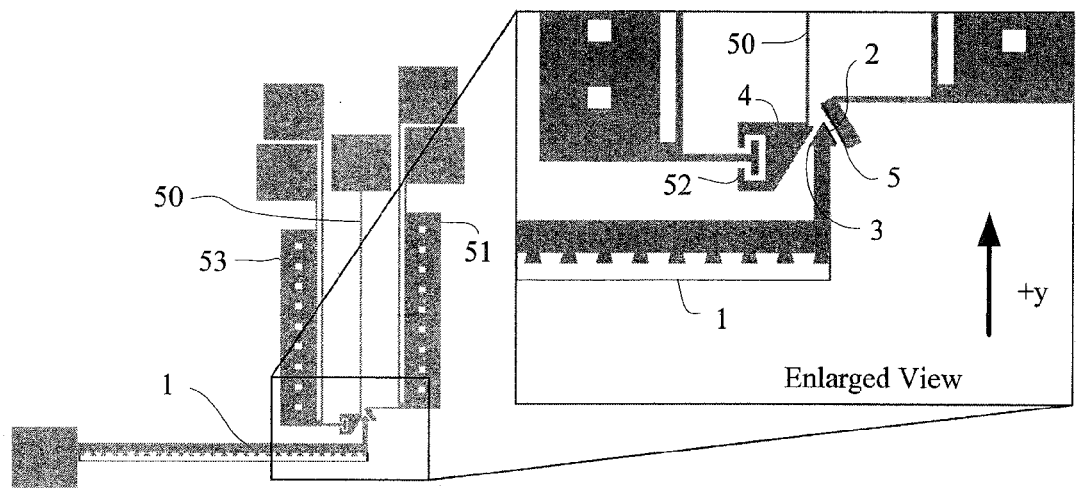
FIG. 8 is a top view of the illustrated embodiment of the sensor in its normal state and ready to sense temperature extremes.
Figure 9:
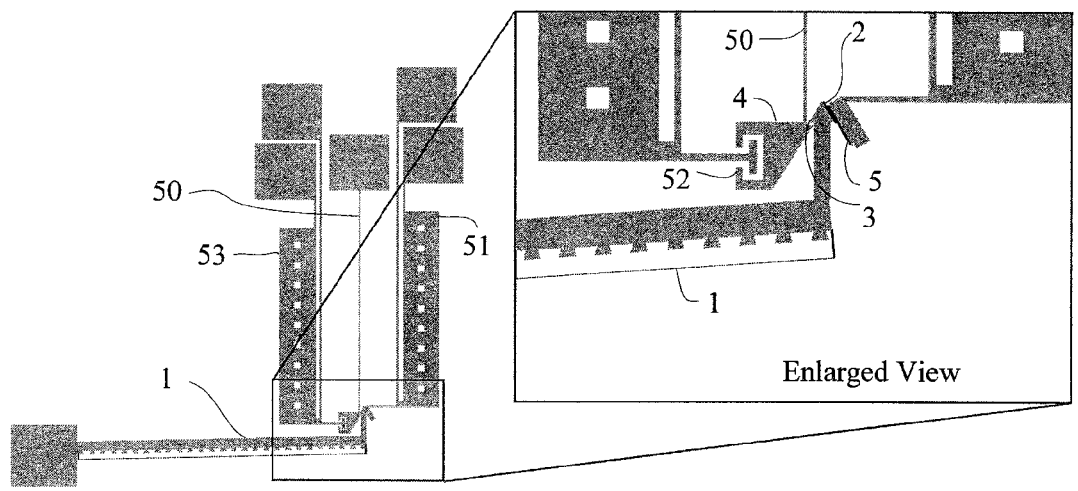
FIG. 9 is a diagram of one embodiment of the sensor in its latched and contacted state after a temperature extreme has been reached.

FIG. 8 illustrates an embodiment of the invention that provides both a latch signal and a programmable trigger signal depending on the level of external temperature. The thermal bimorph 1 responds to temperature levels by bending and displacing itself in the +y direction. The latch 3 on the bimorph 1 is separated from the pawl 4 by a predetermined distance selected for the temperature level at which the temperature sensor is desired to latch. If that temperature level is achieved, the bimorph 1 and latch 3 will move the distance required to engage the latch 3 with the pawl 4. A very flexible beam 50 allows the pawl 4 to move easily perpendicular to the motion of the bimorph 1, and to engage with the latch 3 to prevent the bimorph 1 from returning to its initial state. At this point, the temperature sensor is in its latched state and a closed contact exists between the bimorph 1 and pawl 4. This closed contact can connect a wake-up signal to a microcontroller or to allow interrogation by an external reader. FIG. 9 illustrates the temperature sensor in a latched state.

In addition, when the bimorph is deflected by a temperature, the contacts 2 on the sidewalls of the latch 3 may connect with the contacts 5 that are anchored to the substrate. The surface of the contact sidewalls (2 and 5) are designed to provide reliable and low-resistance contact. The contact actuator 51 connected to the contacts 5 allows the distance between the contacts 5 and the latch contacts 2 to be varied, thereby modifying the temperature level required to make contact and providing user programmability. When the contacts 5 connect to the latch contacts 2, a circuit can be closed that can provide a signal to a microcontroller or be interrogated by an external reader. The temperature level for making a contact between the bimorph and the primary contacts may or may not be the same as that for latching depending on the setting of the contact actuator and the design of the latching mechanism. In other embodiments of the invention, the latching temperature can be adjusted as well.

The temperature sensor is designed to be reset after the sensor (in its latched state) is read or used to provide a signal to an external system. The invention includes a mechanical linkage 52 on the pawl 4 that creates a mechanical connection to a unidirectional reset actuator 53. When the temperature sensor is unlatched and ready to sense a temperature event, the mechanical linkage 52 is not in contact with the pawl 4. As the temperature event occurs, the latch 3 on the bimorph 1 makes contact with the pawl 4 and forces it to move perpendicular to the motion of the bimorph 1. The mechanical linkage 52 decouples the latching motion of the pawl 4 from the reset actuator 53. Without this mechanical linkage, the reset actuator 53 would apply a stiff resistance to the latching motion, making the sensing of low temperature levels difficult.

After the sensor is in a latched state, the reset actuator 53 can be forced to pull in a direction that will engage the linkage 52 with the pawl 4. The illustrated embodiment of the invention uses for the reset actuator 53 a thermal actuator that deflects when a specific amount of current is run through the device. Once the actuator 53 is engaged with the pawl 4, the force from the reset actuator 53 will pull the pawl 4 away from the bimorph 1. When sufficient force is applied, the latch 3 and pawl 4 disengage, thereby releasing the bimorph 1 and allowing it to return to its initial position. At this point, the sensor is ready to monitor another temperature event.

Figure 10:
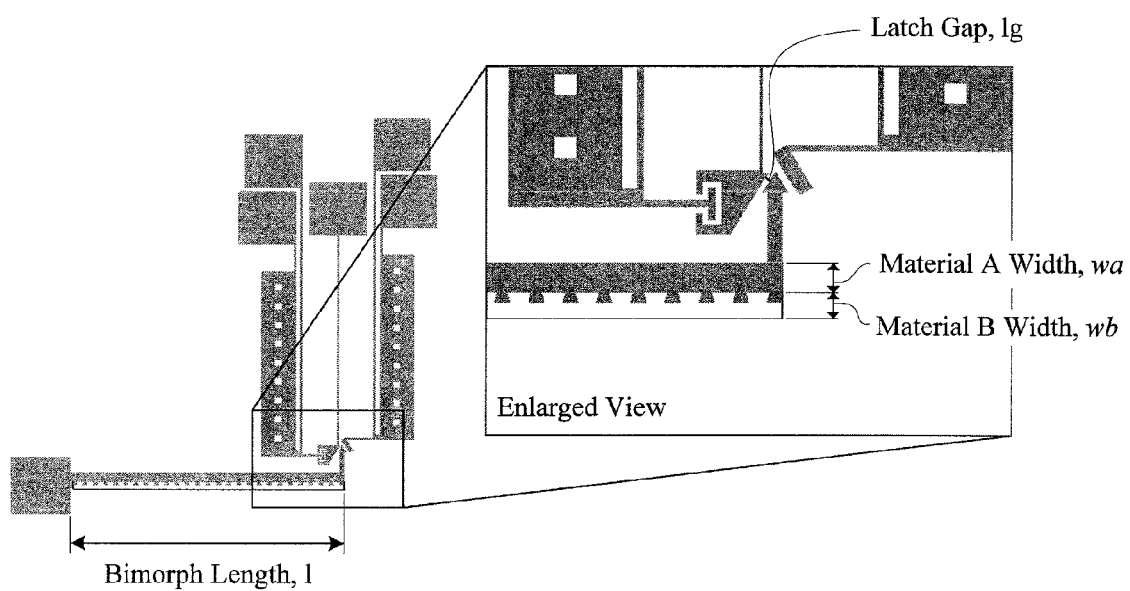
FIG. 10 shows the definition of parameters used in the design of the sensor.

FIG. 10 defines the primary parameters used to design one embodiment of the sensor to detect specific levels of temperature. For a thermal bimorph, the radius of curvature, R, at temperature, T, is given approximately by:

$$R = \frac{wa + wb}{6(\alpha_a + \alpha_b)(T - T_o)}$$

where wa and wb are the widths of materials A and B respectively in the bimorph, $\alpha_a$ and $\alpha_b$ are the coefficients of thermal expansion for materials A and B respectively, and $T_o$ is the temperature at which the bimorph is not bent.

The amplitude of the deflection of the thermal bimorph is dependent on the radius of curvature and beam length, and is given by:

$$\Delta y = R * \left(1 - \cos\left(\frac{l}{R}\right)\right)$$

where $\Delta y$ is the beam displacement, R is the radius of curvature, and l is the length of the beam.

A device will latch if the bimorph deflection is greater than the distance of the latch gap plus the distance across the tip of the pawl, and can be expressed by the following latching condition:

$$\Delta y > lg + lp, \text{ or } (T - T_o) > \frac{(wa + wb)*(lg + lp)}{3(\alpha_a - \alpha_b)*l^2}$$

where lg is the latch gap distance and lp is the distance across the tip of the pawl over which the latch structure must traverse to latch. That distance is defined by the geometry of the tip of the pawl.

Table 1 below contains the temperature levels required for latching the sensor in one embodiment of the invention given Material A width of 10 μm, Material B width of 10 μm, and latching gap of 10 μm for a variety of bimorph lengths.

TABLE 1

Table of design parameters versus temperature levels for latching

| Temperature Level | Bimorph Beam Length, lb |
|---|---|
| 50° C. | 375 μm |
| 75° C. | 263 μm |
| 100° C. | 215 μm |
| 125° C. | 186 μm |

In one embodiment of the invention Material A is silicon and Material B is Polyimide. Other metals would be suitable for use as Material A, and other materials would be suitable for use as Material B, provided that the materials have a large enough coefficient of thermal expansion mismatch to yield a deflection large enough to close the latch gap.

Table 2 below contains test results thermal testing of an embodiment of the invention containing a 500 micron-long beam with an eight (8) micron-wide silicon layer and a sixteen (16) micron-wide polyimide layer.

TABLE 2

Results of Thermal Test of Thermal Bimorph

| Temperature (degrees C.) | Bimorph Movement (microns) |
|---|---|
| 25 | 0.0 |
| 30 | 0.0 |
| 50 | 1.0 |
| 100 | 3.0 |
| 125 | 5.0 |
| 150 | 7.0 |

In one embodiment of the invention, the temperature sensor is used to wake up a microcontroller in an embedded sensing application. In other embodiments, the device is used in standalone applications where the sensor is connected to an RFID tag or other transmitter for remote determination of the temperature environment experienced by shipping containers and products. Similar devices for other environmental variables such as shock, humidity, and chemical concentrations can be developed using the principles disclosed herein.

Figure 11:
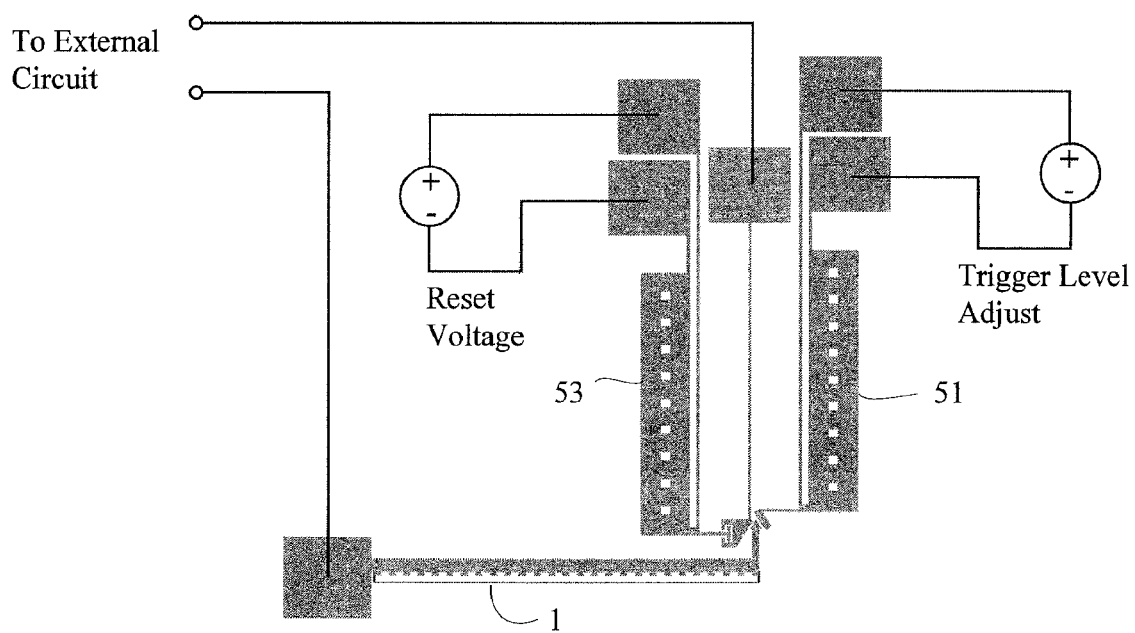
FIG. 11 is a diagram of the electrical interconnection of one embodiment of the sensor.

FIG. 11 illustrates a wiring schematic for an embodiment of the invention that is used for waking up an embedded microcontroller from a sleep mode when a certain temperature level is experienced. In this embodiment, a voltage difference is applied across actuators 53 and 51. In operation a single bias signal is applied to the bimorph 1 of the device. The bias signal could be a voltage or current depending upon the type of readout circuit used. Connections to the external contacts and pawls would be outputs to which the bias signal is connected. These outputs could be connected to microcontroller interrupt lines, to a wireless transceiver, to a large circuit network that performs some function, or a number of other connection and circuits.

Although several embodiments and forms of this invention have been illustrated, it is apparent that those skilled in the art can make other various modifications and embodiments of the invention without departing from the scope and spirit of the present invention. For example, other configurations of the sensor are possible that utilize varying surface features on the contacts, multiple movable contacts, and different actuator types.

Figure 12:
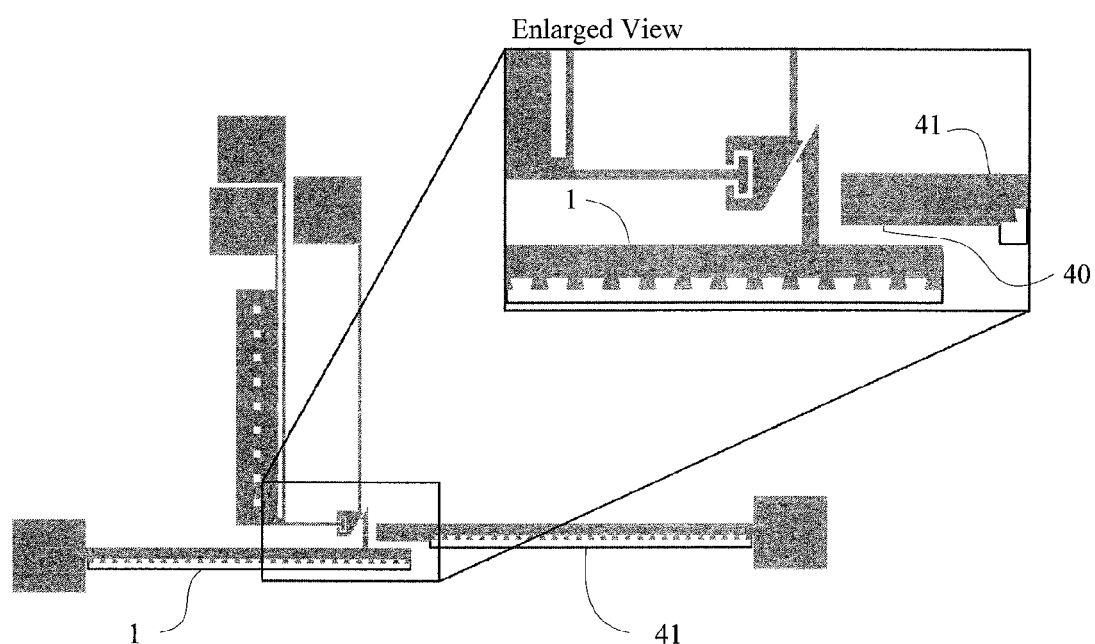
FIG. 12 shows an embodiment of the invention with temperature sensitive contacts that allow operation at lower temperature levels.

One particular embodiment of the invention, shown in FIG. 12, uses the sidewall 40 of a second thermal bimorph 41 as a moving contact to connect with the sensor's main latching bimorph 1. When a temperature load is applied, the moving contact 41 will move out of the way of the main latching bimorph 1 during the latching operation, thereby reducing the amount of force required to meet the latching condition. After the latching occurs and the temperature load is removed from the device, the moving contact 41 will return to its original position and make a connection with the device's main latching bimorph 1. This configuration is useful when designing low temperature trigger devices where the bending force may be insufficient to overcome the retarding force created by the stationary electrical contacts.

Figure 13:
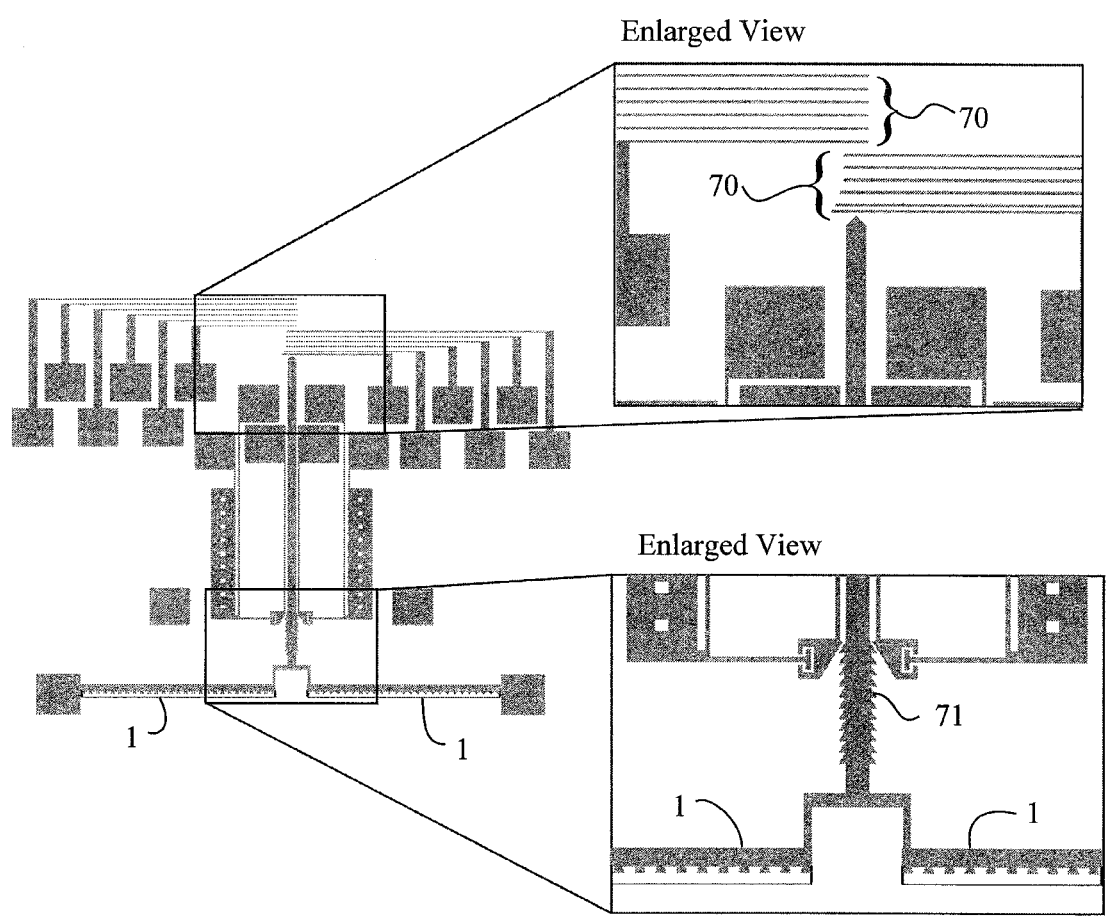
FIG. 13 shows an embodiment of the invention with multiple contacts for detection of multiple temperature levels.

Another embodiment, shown in FIG. 13, includes multiple contacts 70 and multiple latches 71 to allow one sensor device to trigger at and latch at multiple temperature levels that the bimorphs 1 are subjected to.

Another embodiment of the device (not illustrated) uses a capacitive actuator for reset functions instead of a thermal actuator. A capacitive actuator consumes less power but would be suitable for lower force and lower temperature level applications. The configuration would require additional capacitive actuators on the bimorph to move it out of contact with the pawl, thereby eliminating the friction that holds the pawl in contact with the latch. At that point another capacitive actuator could move the pawl out of position, after which the actuator on the bimorph is released, followed by the release of the pawl, at which point the sensor is unlatched and ready for another sensing operation.

Furthermore, other fabrication processes for the device are possible. Any fabrication process that realizes a single thick micromechanical structural layer with 1) conducting sidewalls that can make electrical contact, and 2) sidewall deposition of a material with a different coefficient of thermal expansion from the main micromechanical structural layer can be used to fabricate the device. Examples include bulk micromachining and wafer-bonding fabrication approaches in silicon, silicon dioxide, nickel, titanium and other conductors, as well as LIGA-type fabrication processes using electroplated metals.

Although the embodiments illustrated herein show temperature sensors in which the bimorph responds to temperature increases in order to cause either contact or latching of the sensor, the bimorph also responds to temperature decreases, by bending in the opposite direction. Therefore, other embodiments contemplated that are within the scope of the present invention include devices which sense either temperature decreases or both increases and decreases with the same thermal bimorph. And, for the purposes of this specification, a temperature "load" is defined as either a temperature increase or a temperature decrease.

What is claimed is:

1. A micro-electromechanical thermal bimorph structure comprising:
    a substrate comprising a top layer and a bottom layer, wherein the bottom layer has an etched surface; and
    a beam micromachined from the top layer and anchored to the substrate, the beam extending over and substantially parallel to the etched surface of the bottom layer and having a lateral sidewall patterned with surface features; and
    a coating extending between and covering the surface features along the lateral sidewall of the beam;
    wherein the coated beam moves laterally, substantially in the plane of the etched surface, in response to a temperature load.

2. The micro-electromechanical thermal bimorph structure of claim 1, wherein the beam and the coating have sufficiently different coefficients of thermal expansion such that the coated beam bends laterally upon the application of a temperature load.

3. The micro-electromechanical thermal bimorph structure of claim 2, wherein the coating is supported only by the beam.

4. The micro-electromechanical thermal bimorph structure of claim 3, in which the pattern comprises a dovetail.

5. The micro-electromechanical thermal bimorph structure of claim 4, in which the beam is a cantilevered beam.

6. The micro-electromechanical thermal bimorph structure of claim 1, wherein the sidewall of the beam is micromachined with the pattern of surface features.

7. A micro-electromechanical thermal bimorph structure comprising:
    a substrate comprising a device layer and a handle wafer, wherein the device layer is composed of a first material, and wherein the handle wafer has an etched surface; and
    a beam formed from the first material and anchored to the substrate, the beam extending over and substantially parallel to the etched surface of the handle wafer and having a sidewall defining a pattern of surface features; and a second material deposited upon a surface of the beam extending between and covering the surface features to create a thermal bimorph;

wherein the first material and the second material have sufficiently different coefficients of thermal expansion such that the thermal bimorph bends laterally upon the application of a temperature load.

8. The micro-electromechanical thermal bimorph structure of claim 7, wherein the coating is supported only by the beam.

9. The micro-electromechanical thermal bimorph structure of claim 8, in which the pattern comprises a dovetail.

10. The micro-electromechanical thermal bimorph structure of claim 9, in which the beam is a cantilevered beam.

11. The micro-electromechanical thermal bimorph structure of claim 7, wherein the beam is micromachined from the first material with the pattern of surface features.

12. A method of producing a micro-electromechanical thermal bimorph structure comprising:

applying a pattern to a substrate, wherein the substrate is comprised of a device layer and a handle wafer, wherein the device layer is composed of a first material;

etching the device layer to form a microstructure including a beam having at least one lateral sidewall patterned with surface features;

applying a second material onto the first material to extend between and cover the surface features, the second material having a coefficient of thermal expansion different from the first material;

patterning the second material to leave portions of the second material on the microstructure to form a layer of the second material along the lateral sidewall of the beam; and partially releasing the microstructure from the device layer via an etching process to create a thermal bimorph anchored to the substrate.

13. The method of claim 12, further comprising depositing material for electrical contacts onto the microstructure.

14. The method of claim 12, wherein the microstructure comprises a bimorph beam anchored to the substrate extending over and substantially parallel to the handle layer; and wherein the bimorph beam bends laterally upon the application of a temperature load.

* * * * *

UNITED STATES PATENT AND TRADEMARK OFFICE
CERTIFICATE OF CORRECTION

PATENT NO. : 7,629,664 B1  Page 1 of 1
APPLICATION NO. : 11/149882
DATED : December 8, 2009
INVENTOR(S) : Elliott et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 910 days.

Signed and Sealed this

Second Day of November, 2010

David J. Kappos
*Director of the United States Patent and Trademark Office*